United States Patent [19]

McCorkle

[11] 4,069,924
[45] Jan. 24, 1978

[54] METHODS AND APPARATUS FOR POSITIONING AN ARTICLE LATERALLY ON A SUPPORT

[75] Inventor: Richard A. McCorkle, Allentown, Pa.

[73] Assignee: Western Electric Co., Inc., New York, N.Y.

[21] Appl. No.: 742,930

[22] Filed: Nov. 18, 1976

[51] Int. Cl.$^2$ ............................................. B65G 35/00
[52] U.S. Cl. ..................................... 214/1 R; 29/587;
198/345; 214/152
[58] Field of Search ................. 29/587, 406, 734, 743, 29/759; 214/1 R, 1 C, 1 F, 1 B, 1 BS, 1 BT, 1 BB, 152; 198/382, 383, 344, 345

[56] References Cited

U.S. PATENT DOCUMENTS

| | | | |
|---|---|---|---|
| 3,221,374 | 12/1965 | Fornes | 53/367 X |
| 3,355,856 | 12/1967 | Randrup | 198/382 |
| 3,472,356 | 10/1969 | Reppert | 214/1 C X |

FOREIGN PATENT DOCUMENTS

| | | | |
|---|---|---|---|
| 1,482,616 | 1/1969 | Germany | 53/367 |

OTHER PUBLICATIONS

Western Electric Technical Digest No. 40–Oct. 1975, p. 7; "Mechanism for Centering Substrates," Cross, et al.

*Primary Examiner*—Frank E. Werner
*Attorney, Agent, or Firm*—R. Y. Peters

[57] ABSTRACT

Subassemblies, comprising an integrated circuit bonded to a conductor pattern on a small ceramic substrate, are automatically bonded to lead frames. In carrying out this operation, each subassembly is placed on a support and precisely positioned thereon. Rollers are symmetrically disposed about the centerline of a resiliently mounted roller support or yoke. The minimum distance between opposite rollers is less than the distance across the subassembly and the centerline is coincident with the position desired on the support. The yoke and rollers are advanced toward the subassembly to contact it and shift it on the support until opposite rollers contact opposite sides of the subassembly. At that time the assembly is positioned and the advancement of the rollers stops. Vacuum is applied to maintain the position of the subassembly on the support for bonding.

4 Claims, 5 Drawing Figures

METHODS AND APPARATUS FOR POSITIONING AN ARTICLE LATERALLY ON A SUPPORT

BACKGROUND OF THE INVENTION

1. Field of the Invention

The invention relates to methods and apparatus for positioning an article on a support and, more particularly, for moving rotatable members, symmetrically disposed with respect to a predetermined location on the support, into engagement with the article to position the article in the predetermined location.

2. Description of the Prior Art

In the prior art, square electronic circuit substrates have been placed on a pedestal or support and positioned laterally thereon by moving pyramidal cavities toward the support, e.g., in the manner of R. Cross et al., technical digest, Vol. 40, Western Electric Co., New York (Oct. 1975) p. 7. A sloping side or adjacent sides of the cavity contact a side or adjacent sides of the substrate and force it to move laterally until opposite sides of the cavity contact opposite sides of the substrate. When this occurs, the substrate is located in its proper position and rotated so that its sides are parallel to the cavity walls.

The substrates are generally fabricated from hard materials, such as ceramics, by scribing and breaking procedures. This generates very sharp abrasive corners or edges on which the pyramidal cavities must act. Thus, the sides of the cavities wear rapidly even if they themselves are made of ceramic. The wear not only manifests itself as a change in the slope of the cavity walls and change in cavity size but as a ledge, formed around the inside of the cavity, which makes the cavity ineffective for the purposes intended.

SUMMARY OF THE INVENTION

Accordingly, it is an object of the invention to provide new and improved methods and apparatus for positioning an article laterally on a support.

Another object of the invention is to provide new and improved methods and apparatus for positioning an article at a predetermined location on a support.

These and other objectives are accomplished by replacing the walls of the cavities with rotatable members and mounting the members in a predetermined relationship with respect to the support. The rotatable members roll on contact with the article and thus reduce wear from rubbing. Further, the members continually present a new surface to the articles because they rotate each time they position an article. Still further the rotatable members wear much longer than pyramids with fixed sides because the circumference of the rotatable member can be made much longer than the side of a pyramid.

BRIEF DESCRIPTION OF THE DRAWINGS

Other objects and features of the invention will be more readily understood from the following detailed description of the specific embodiments thereof, when read in conjunction with the accompanying drawings in which.

DETAILED DESCRIPTION

Figure 1:
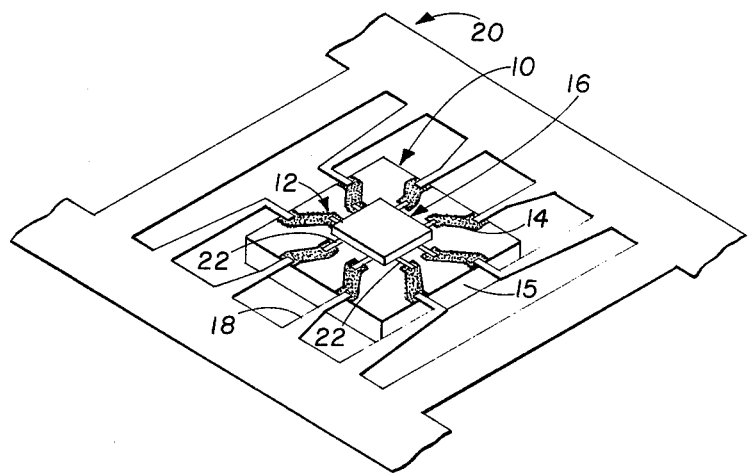
FIG. 1 is an isometric view of a ceramic substrate assembly and a lead frame bonded thereto.

Referring now to FIG. 1, there is shown a substrate assembly 10 having a pattern 12 of conductors 14 on a ceramic substrate 15. The substrate may be alumina, square 0.1 to 0.2 inches on a side or rectangular, e.g., 0.2 by 0.4 inches. The pattern of conductors is formed by methods, well known in the art, which include depositing metal films such as tantalum, palladium and gold, on the surface of an alumina substrate of and removing unwanted metal by photoresist and etch techniques to leave the desired pattern. A semiconductor device 16, such as a beam-lead integrated circuit, may be bonded to the inner ends of the conductors 14, and leads 18, which are attached to a lead frame 20, may be bonded to the outer ends of the conductors 14. The lead frame 20 usually contains several sets of leads 18 so that plural assemblies 10 may be bonded to one frame 20.

The leads 18 may be economically bonded to the conductors 14 by several different methods including mass bonding and automatic machine bonding of individual assemblies 10. The device 16 is joined to the conductors 14 by thermocompressively bonding its beam leads 22 to the inner ends of the conductors. Also, the leads 18 are bonded to the outer ends of the conductors 14 by thermocompressive bonding. This requires that the assembly 10 be very accurately positioned with respect to its support and the support be accurately positioned with respect to the leads 18 at the time of bonding. The methods and apparatus for precisely positioning the assembly 10 on its support, so that the leads may be properly bonded to the assembly, are the subject matter of this invention and will be described in the following paragraphs.

Figure 2:
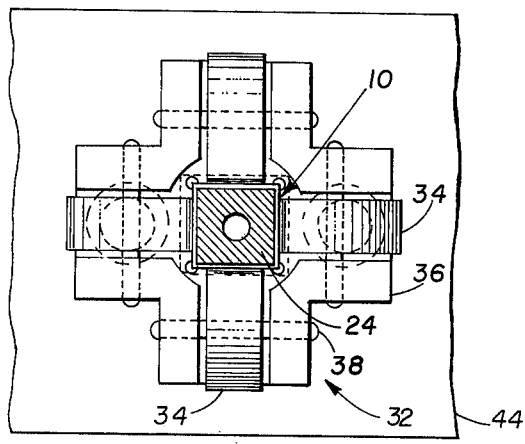
FIG. 2 is a bottom view of the apparatus of the invention for positioning the assembly of FIG. 1 on a support.
Figure 3:
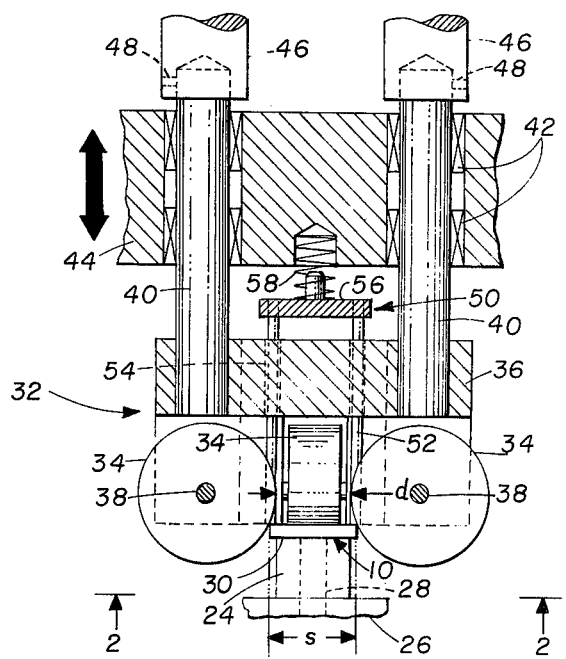
FIG. 3 is a cross sectional elevation of the apparatus of FIG. 2, showing rotatable members used in positioning the assembly of FIG. 1.

Referring now to FIGS. 2 and 3, the assembly 10 rests on a pedestal or support 24 which is one of a plurality of such supports mounted on an indexing table 26 of an assembly machine. Only a portion of the table 26 is shown. The table 26 rotates about a vertical axis and moves the support 24 from a load station (not shown) where the assembly 10 is placed on the support 24 to a positioning station where assembly 10 is accurately positioned on the support by positioning apparatus designated generally by the numeral 32. The support 24 includes a passage 28 which terminates at a support surface 30, on which the assembly 10 is placed, and is connected to a source of vacuum.

The positioning apparatus 32 includes four rollers or cylindrical members 34 which are mounted in a yoke 36 and are free to rotate about shafts 38. The members 34 are preferably of a very hard abrasive-resisting materials such as carbides, ceramics and sapphire.

The apparatus 32 is mounted at the positioning station for vertical movement, as indicated by the arrow, toward and away from the support 24 and the substrate assembly 10 on the surface 30. Guide rods 40 are fixed to the yoke 36 and are free to slide in bushings 42, e.g., linear ball bushings, which are mounted in a vertically movable portion 44 of the assembly machine.

Weights 46 are removably fastened to the opposite ends of the rods 40 from the yoke 36 by set screws 48.

The weights 46 urge the yoke 36 and cylindrical members 34 downward and, at the same time, act as collars to retain the rod-yoke assembly suspended by the portion 44 when the portion 44 is in its raised position.

The cylindrical members 34 are symmetrically disposed about the centerline of the yoke 36. The distance between centers of opposite rollers and the roller diameters are such that the minimum distance d (refer to FIGS. 3 and 5) between opposite rollers is slightly less than the distance across the assembly 10. The yoke 36 is supported by the rods 40 and machine portion 44 in symmetrical relation to a point on the support 24, conveniently and usually the center of the surface 30. However, the objective is to position the assembly 10 on the support 24 such that the assembly will be in the correct position and orientation at a bonding station for bonding to the lead frame 20 upon the next index of the table 26. The apparatus 32 is positioned relative to the support 24 with this in mind. Further, the sides of the assembly 10 will be forced parallel to the cylindrical surfaces of the members 34 and, therefore, the apparatus 32 must be and is accurately oriented so that the assembly 10 will be accurately oriented also. Orientation means rotation about a centerline normal to the surface containing the conductor pattern.

The assembly 10 is placed on the surface 30 of the support 24 at the load station (not shown) in its approximate position and orientation. The table 26 then indexes the support 24 and assembly 10 into position beneath apparatus 32 in the positioning station. The portion 44 is advanced toward the assembly 10, i.e., downward toward the support 24 and the predetermined location thereon, until a first member 34 contacts an upper edge of the assembly 10. As downward movement of the portion 44 is continued, the assembly 10 is forced to move laterally on the surface 30 toward a second and opposite member 34 under the urging of the weights 46 and first member 34. When the assembly 10 has moved laterally until both the first and second members 34 contact the assembly 10 on opposite upper edges, the assembly is accurately positioned and oriented. Continued downward movement of the portion 44 produces no further downward movement of the yoke 36 and cylindrical members 34, but such movement frees the weights 46 from the portion 44 so that they become fully effective in positioning the assembly 10.

When the portion 44, and thereby the apparatus 32, is raised, the cylindrical members 34 may tend to pinch the assembly 10 between them and tend to raise the assembly with the apparatus 32. Accordingly, a pressure member 50 is provided to strip the assembly 10 from the members 34 and includes stripper pins 52, mounted in a stripper plate 56, guided by apertures 54 in the yoke 36 and urged downwardly by a spring 58. The length of the pins 52 is such that the ends of the pins contact the assembly 10 before the cylindrical members 34 and, of course, break contact after the cylindrical members 34 disengage from the edges of the assembly 10. Thus, the assembly 10 is firmly held on the surface 30 against disturbance while the members 34 are being disengaged.

Prior to the start of index to the bonding station, vacuum may be applied to the vacuum passage 28 to maintain the assembly 10 in its position on the support.

It is possible to eliminate the pressure member 50 by applying vacuum to passage 28 continuously, i.e., both prior to disengagement of cylindrical members 34 and afterward, both to strip the assembly 10 from the members 34 and to maintain it on the support surface 30. However, a relatively light pressure, if any, is needed for stripping the assembly 10 from the members 34 while a much firmer pressure is required to maintain the assembly 10 in position on the surface 30.

Since the cylindrical member must work against this pressure in positioning the assembly 10, the firmer pressure will cause considerably faster wear if continuously applied. The separate means for applying stripping and holding pressure may, therefore, be preferred.

In either case, however, the assembly 10 will be accurately positioned on its support to coincide with tooling and cooperate in subsequent operations, such as bonding, which must be performed.

ALTERNATIVE APPARATUS

Figure 4:
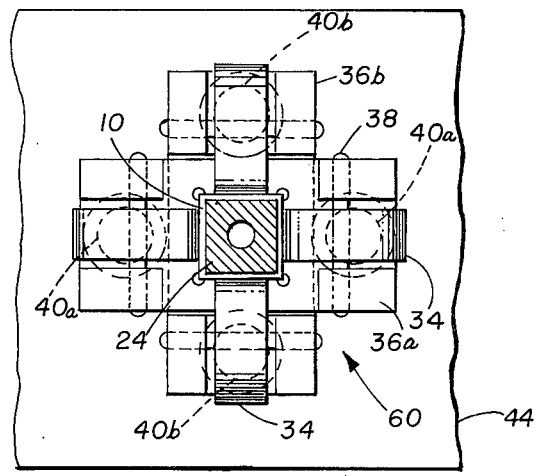
FIG. 4 is a bottom view of an alternative apparatus for more precise positioning.
Figure 5:
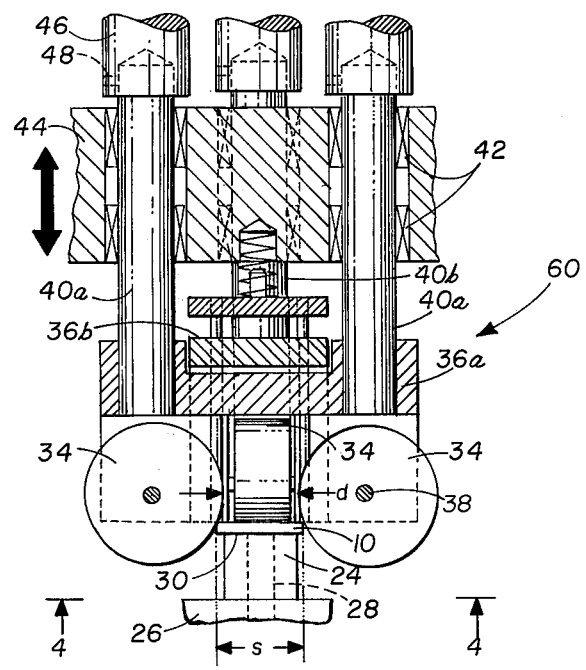
FIG. 5 is a cross sectional elevation of the apparatus of FIG. 4.

Referring now to FIGS. 4 and 5, which are bottom and cross sectional elevation view, respectively, there is shown an alternative positioning apparatus designated generally by the numeral 60.

In the apparatus 60, the yoke is in two separate parts 36a and 36b independently supported by rods 40a and 40b. Essentially, the rest of the positioning apparatus 60 remains the same as positioning apparatus 32. In operation, both work in the same manner, except that, since the cylindrical members 34 are mounted in separate yokes 36a and 36a, when both members 34 of a pair contact opposite side of the assembly 10, the downward motion of only that yoke, e.g., 36a, stops. Downward motion of the other yoke 36b continues until its cylindrical members 34 contact the two remaining sides of the assembly 10. Thus, the apparatus 60 will precisely position the assembly 10 even though it may not be exactly square. More importantly, the apparatus 60 will position rectangular assemblies 10 which have one pair of opposite sides intentionally longer than the other. In this case, the cylindrical members 34 in yoke 36a, for example, are mounted at a center distance to suit the longer sides and in yoke 36b at a distance to suit the shorter sides.

While there has been described herein practical embodiments of the present invention, it is understood that various modifications and refinements which depart from the disclosed embodiment may be adapted without departing from the spirit and the scope of the present invention. For example, the cylindrical member 34 may be modified in size and mounting in the support yoke 36 to suit positioning semiconductor chips; or the assembly 10 may be nonrectangular parallelogram and the members 34 made conical to adapt the sloped sides of the parallelogram; or triangular substrates may be positioned by three appropriately supported and positioned cylindrical members 34; or springs may be used in place of weights.

What is claimed is:

1. A method of positioning an article on a support, which comprises the steps of:
   a. placing the article on a support having an article support surface the article being movable laterally on the surface for precise positioning;
   b. moving a plurality of rotatable and symmetrically disposed locating members, which are mounted in predetermined location in relation to the support, toward the support to engage said members with the article to position said article on said support surface at said predetermined location; and
   c. urging the article against the support surface with a yieldingly mounted pressure member to hold said article on the support surface while disengaging said rotatable locating members therefrom.

2. A method as recited in claim 1, wherein a vacuum passage terminates at the support surface, and which comprises the further step of applying a vacuum to said passage to maintain the position of the article on the support.

3. An apparatus for positioning an article on a support, which comprises:
   a support for the article, the article being movable laterally on said surface for precise positioning;
   a plurality of rotatable members, yieldingly mounted in independent pairs in symmetrical relation to a predetermined location on the support, for engaging and positioning the article;
   pressure members to urge the article against the support until the rotatable members are disengaged from the article; and
   means for moving the rotatable and pressure members toward the location to engage and position the article on the support at the predetermined location and to urge the article against the support surface while the rotatable members are disengaged from the article.

4. An apparatus as recited in claim 3, wherein the rotatable members comprise a material selected from the group comprising carbide, sapphire and alumina.

* * * * *

UNITED STATES PATENT OFFICE
CERTIFICATE OF CORRECTION

PATENT NO. : 4,069,924
DATED : January 24, 1978
INVENTOR(S) : RICHARD A. MC CORKLE It is certified that error appears in the above-identified patent and that said Letters Patent are hereby corrected as shown below:

In the specification, column 3, line 10, "distance" should read --distance s--.

Column 4, line 18, "view" should read --views--;
line 27, "36a and 36a" should read --36a and 36b--

Signed and Sealed this

Eighth Day of August 1978

[SEAL]

Attest:

RUTH C. MASON
Attesting Officer

DONALD W. BANNER
Commissioner of Patents and Trademarks